United States Patent
Lin et al.

(10) Patent No.: US 7,423,913 B2
(45) Date of Patent: Sep. 9, 2008

(54) STRUCTURES AND METHODS FOR ENHANCING ERASE UNIFORMITY IN A NITRIDE READ-ONLY MEMORY ARRAY

(75) Inventors: Ching Chung Lin, Banciao (TW); Ken Hui Chen, Dali (TW); Nai Ping Kuo, Hsinchu (TW); Han Sung Chen, Hsinchu (TW); Chun Hsiung Hung, Hsinchu (TW); Wen Yi Hsieh, Seagun Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/695,668

(22) Filed: Apr. 3, 2007

(65) Prior Publication Data

US 2007/0211540 A1    Sep. 13, 2007

Related U.S. Application Data

(62) Division of application No. 11/210,425, filed on Aug. 24, 2005, now Pat. No. 7,236,404.

(51) Int. Cl.
*G11C 11/34* (2006.01)
(52) U.S. Cl. ............................. 365/185.29; 365/185.18
(58) Field of Classification Search ............ 365/185.29, 365/185.18, 185.16
See application file for complete search history.

(56) References Cited

U.S. PATENT DOCUMENTS

| 5,122,985 A * | 6/1992 | Santin ................ 365/185.19 |
| 6,345,000 B1 * | 2/2002 | Wong et al. .......... 365/185.29 |
| 6,545,911 B2 | 4/2003 | Chou et al. |
| 6,577,540 B2 | 6/2003 | Choi |
| 6,795,348 B2 * | 9/2004 | Mihnea et al. ......... 365/185.29 |
| 6,891,760 B2 * | 5/2005 | Ohtani ................ 365/185.29 |

* cited by examiner

*Primary Examiner*—Anh Phung
(74) *Attorney, Agent, or Firm*—Haynes Beffel & Wolfeld LLP

(57) ABSTRACT

A virtual ground nitride read-only memory array has a matrix of nitride read-only memory cells in which during an erase operation the non-erasing side of nitride read-only memory cells are connected to a common node for enhancing the erase uniformity of the nitride read-only memory array. If an operation requests erasing on the left side of nitride read-only memory cells, a positive voltage is supplied from an internal power supply to the left side for each of the nitride read-only memory cells, and the right side for each of the nitride read-only memory cells is discharged to a common node. The voltage level of the common mode is selected to be sufficiently high in order to prevent from punch through while at the same time sufficiently low to maintain the lateral electric field for erase operation to function optimally.

7 Claims, 8 Drawing Sheets

STRUCTURES AND METHODS FOR ENHANCING ERASE UNIFORMITY IN A NITRIDE READ-ONLY MEMORY ARRAY

RELATED APPLICATIONS

This application is a division of U.S. patent application Ser. No. 11/210,425 filed on 24 Aug. 2005, now U.S. Pat. No. 7,236,404, issued on Jun. 26, 2007, which application is incorporated herein by reference.

BACKGROUND OF THE INVENTION

1. Field of the Invention

The present invention relates generally to non-volatile memory devices, and in particular to improve erase uniformity of flash nitride read-only memory cells.

2. Description of Related Art

Electrically programmable and erasable non-volatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a non-volatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers because of the scalability and simplicity of the manufacturing processes. Memory cell structures (or charge trapping memory cells), based on charge trapping dielectric layers include structures known by the industry names Nitride Read-Only Memory, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Nitride read-only memory devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of a nitride read-only memory flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious when the technology keeps scaling down.

A typical flash memory cell structure positions a tunnel oxide layer between a conducting polysilicon tunnel oxide layer and a crystalline silicon semiconductor substrate. The substrate refers to a source region and a drain region separated by an underlying channel region. A flash memory read can be executed by a drain sensing or a source sensing. For source side sensing, one or more source lines are coupled to source regions of memory cells for reading current from a particular memory cell in a memory array.

A traditional floating gate device stores 1 bit of charge in a conductive floating gate. The advent of nitride read-only memory cells in which each nitride read-only memory cell provides 2 bits of flash cells that store charge in an Oxide-Nitride-Oxide (ONO) dielectric. In a typical structure of a nitride read-only memory cell, a nitride layer is used as a trapping material positioned between a top oxide layer and a bottom oxide layer. The ONO layer structure effectively replaces the gate dielectric in floating gate devices. The charge in the ONO dielectric with a nitride layer may be either trapped on the left side or the right side 103 of a nitride read-only memory cell.

A circuit diagram in FIG. 2 illustrates one conventional memory cell structure of a nitride read-only memory 100 with a single side erase in which the non-erasing side is left floating. The band-to-band hot hole injection is used to conduct a single side erase to the nitride read-only memory cell 100. The nitride read-only memory cell 100 comprises three nodes or terminals, a first node 101, a second node 102, and a third node 103. The first node 101 refers to a gate terminal. Because the nitride read-only memory 100 operates with a virtual ground, the second node 102 could function either as a source node or a drain while the third node 103 could function either as a drain node or a source node. During an erase operation to the node 102, which refers to the left side of the nitride read-only memory cell 100, the node 101 is connected to a negative voltage supplied by a negative pump circuit, the node 102 is connected to a positive voltage supplied by a positive pump circuit, and the node 103 is left floating. The node 103 in the nitride read-only memory cell 100 may be coupled to a voltage level that is uncertain, e.g. 1 volt or 4 volts, which could cause a variation in the erase of memory cells in a memory array. A similar type of concern exists when erasing the node 103. During an erase operation of the node 103, the node 101 is connected to a negative voltage supplied by a negative pump circuit, the node 102 is left floating, and the node 103 is connected to a positive voltage supplied by a positive pump circuit. In this instance, the node 102 in the nitride read-only memory cell 100 may be coupled to a voltage level that is uncertain, e.g. 1 volt or 4 volts, which could cause a variation in the erase of memory cells in a memory array.

In FIG. 2, there is shown a circuit diagram illustrating another conventional memory cell structure of a nitride read-only memory cell 200 with a single side erase in which the non-erasing side is connected to ground. The nitride read-only memory cell 200 comprises three nodes, a first node 201, a second node 202, and a third node 203. During an erase operation to the node 202, the node 201 is connected to a negative voltage supplied by a negative pump circuit, the node 202 is connected to a positive voltage supplied by a positive pump circuit, and the node 203 is connected ground. The risk in this configuration is that if the voltage level on the node 202 exceeds the punch-through voltage of the nitride read-only memory cell 200, a positive pump circuit may crash, which leads to the erase function to fail. A similar type or problem exists when erasing the node 203. During an erase operation to the node 203, the node 201 is connected to a negative voltage supplied by a negative pump circuit, the node 202 is connected to ground, and the node 203 is connected to a positive voltage supplied by a positive pump circuit. A punch-through scenario could occur if the node 203 exceeds the punch-through voltage of the nitride read-only memory cell 200. The positive pump circuit may crash, which leads to the erase function to fail.

A frequently used technique to program nitride read-only memory cells in a nitride read-only memory array is the hot hole electron injection method. During a erase operation, a common technique used to erase memory cells is called the band-to-band hot hole injection where the erase ability is highly dependent on the lateral electric field. The other side potential, from the side that is being erased, of a nitride read-only memory cell is likely to have a lateral electric field effect on the erase ability. Evaluating the endurance and retention of a nitride read-only memory array, the lack of uniformity in erase ability causes a margin loss due to cycling and baking. The other side of nitride read-only memory cells are left floating (or connected to ground) which may be coupled to an uncertain voltage level (e.g. 1 volt or 4 volts), which causes an variation of the erase threshold of array cells. This in turn causes Vt distribution after an erase operation to be wider. The variation of uncertain voltage level may result in over-erasing. On the other hand, if the other side is connected to ground, a punch-through may cause the pump circuit to crash when the bit line bias is over the punch-through voltage. Consequently, during an erase operation of a block, the nitride read-only memory cells where some of the nodes are left floating may cause lack of uniformity in voltage level applied for erase the nitride read-only memory cells in a nitride read-only memory array.

Therefore, there is a need to design a nitride read-only memory array that enhances the erase uniformity of single-side erase among nitride read-only memory cells in a nitride read-only memory array.

SUMMARY OF THE INVENTION

A virtual ground nitride read-only memory array has a matrix of nitride read-only memory cells in which during an erase operation the non-erasing side of nitride read-only memory cells are connected to a common node for enhancing the erase uniformity of the nitride read-only memory array. If an operation requests erasing on the left side of nitride read-only memory cells, a positive voltage is supplied from an internal power supply to the left side for each of the nitride read-only memory cells, and the right side for each of the nitride read-only memory cells is discharged to a common node. If an operation requests erasing the right side of nitride read-only memory cells, a positive voltage is supplied from the internal power supply to the right side for each of the nitride read-only memory cells, and the right side for each of the nitride read-only memory cells is connected to the common node. The voltage level of the common mode is selected to be sufficiently high in order to prevent from punch through while at the same time sufficiently low to maintain the lateral electric field for erase operation to function optimally.

In an alternative embodiment, non-erasing sides of nitride read-only memory cells in the nitride read-only memory array are connected to a current source during an erase operation for enhancing the erase uniformity of the nitride read-only memory array. If an operation requests erasing the left side of nitride read-only memory cells, a positive voltage is supplied from an internal power supply to the left side for each of the nitride read-only memory cells, and the right side for each of the nitride read-only memory cells is discharged to a current source. If an operation requests erasing the right side of nitride read-only memory cells, a positive voltage is supplied from the internal power supply to the right side for each of the nitride read-only memory cells, and the right side for each of the nitride read-only memory cells is connected to the current source.

Broadly stated, a non-volatile memory structure, comprises a memory array having a plurality of nitride read-only memory cells in an x by y matrix, a first column of the memory array having a first nitride read-only memory cell and a second nitride read-only memory cell, each nitride read-only memory cell having a first node, a second node, and a third node; a first metal bit line connecting to a second node of the first nitride read-only memory and connecting to a second node of the second nitride read-only memory; and a second metal bit line connecting to a third node of the first nitride read-only memory and connecting to a third node of the second nitride read-only memory.

Advantageously, the present invention enhances the erase uniformity of nitride read-only memory cells in the nitride read-only memory array, as well as improving the endurance and retention of nitride read-only memory cells. The present invention also avoids a pump circuit from crashing due to the occurrence of punch through by selecting a voltage that is sufficiently high yet the voltage is sufficiently low to maintain the lateral electric field for erase ability.

The structures and methods regarding to the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

DETAILED DESCRIPTION OF EMBODIMENTS OF THE INVENTION

Figure 1:
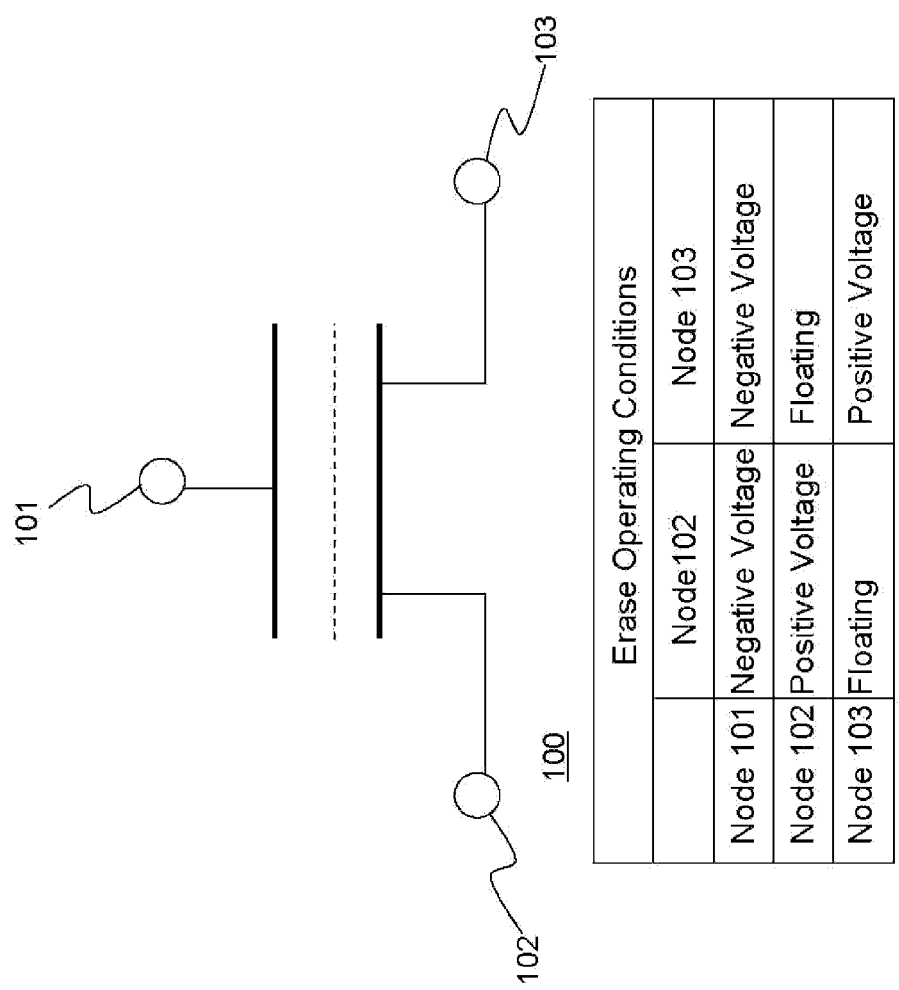
FIG. 1 is a circuit diagram illustrating one conventional memory cell structure of a nitride read-only memory with a single side erase in which the non-erasing side is left floating.
Figure 2:
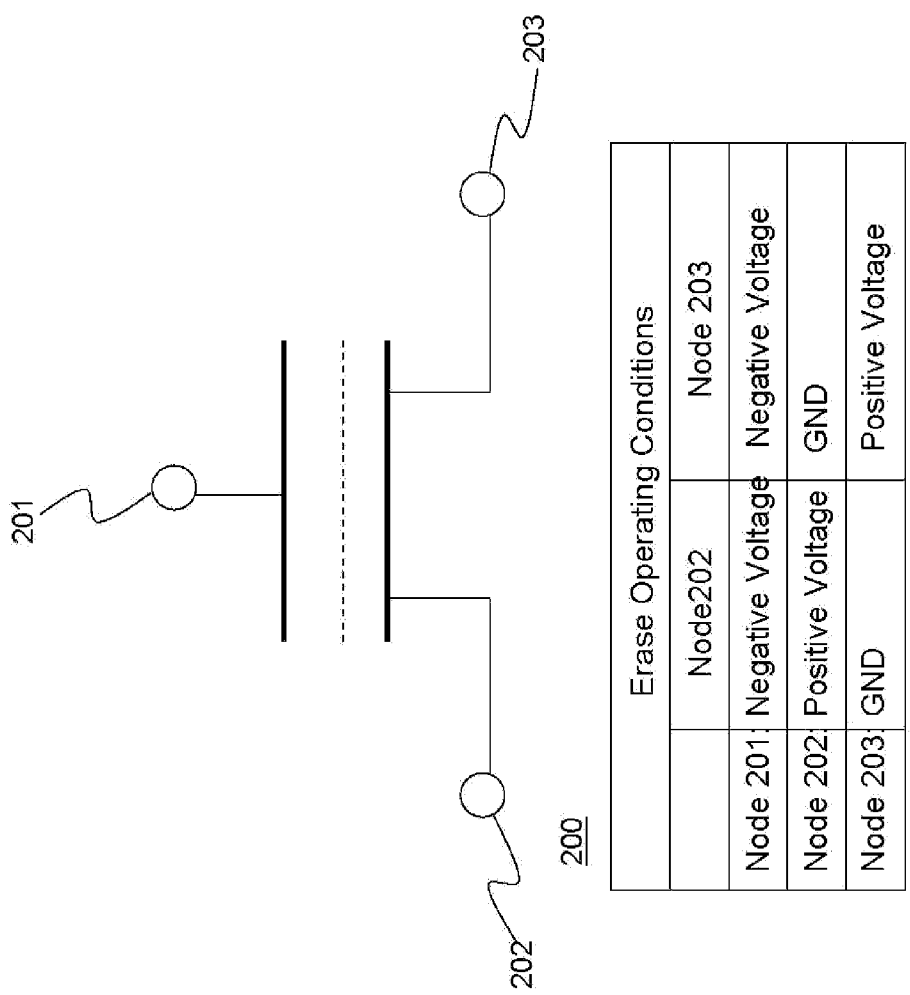
FIG. 2 is a circuit diagram illustrating another conventional memory cell structure of a nitride read-only memory cell with a single side erase in which the non-erasing side is connected to ground.
Figure 3:
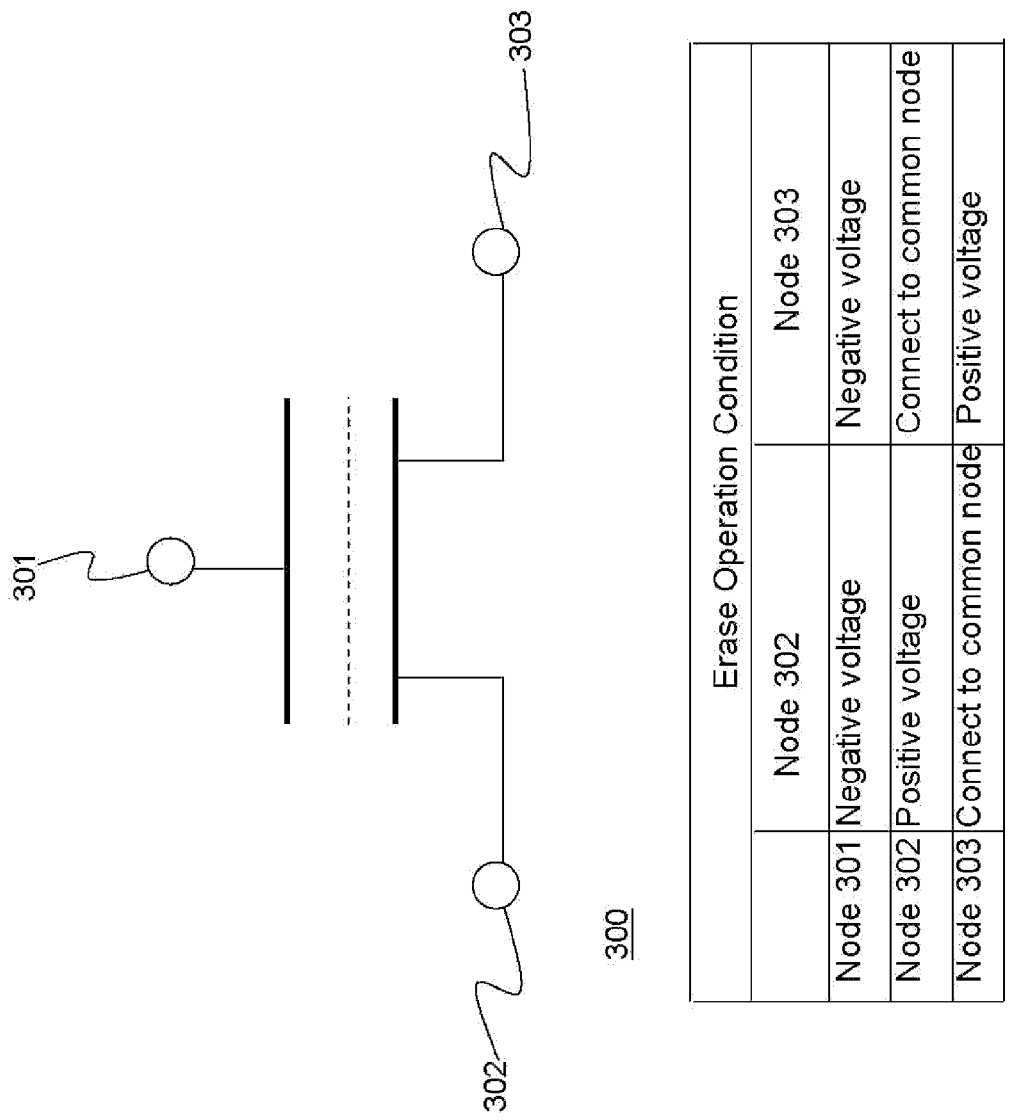
FIG. 3 is a circuit diagram illustrating a first embodiment of a memory cell structure in a nitride read-only memory cell having a node that is connected to a common node during a single side erasing operation in accordance with the present invention.

Referring now to FIG. 3, there is shown a circuit diagram illustrating a first embodiment of a memory cell structure in a nitride read-only memory cell 300 having a node that is connected to a common node during a single side erasing operation. The nitride read-only memory cell structure 300 having a first node 301, a second node 302 and a third node 303. During a single side erase operation of the second node 302, the first node 301 is connected to a negative pump circuit, the node 302 is connected to a positive pump circuit, and a third node is connected to a common node. During a single side erase operation of the third node 303, the first node 301 is connected to a negative pump circuit, the node 302 is connected to a common node, and a third node is connected to a positive voltage. The voltage level of the common node will be selected to be sufficiently high to prevent punch through from occurring while selected to be sufficiently low to maintain the lateral electric field for erase ability.

Figure 4:
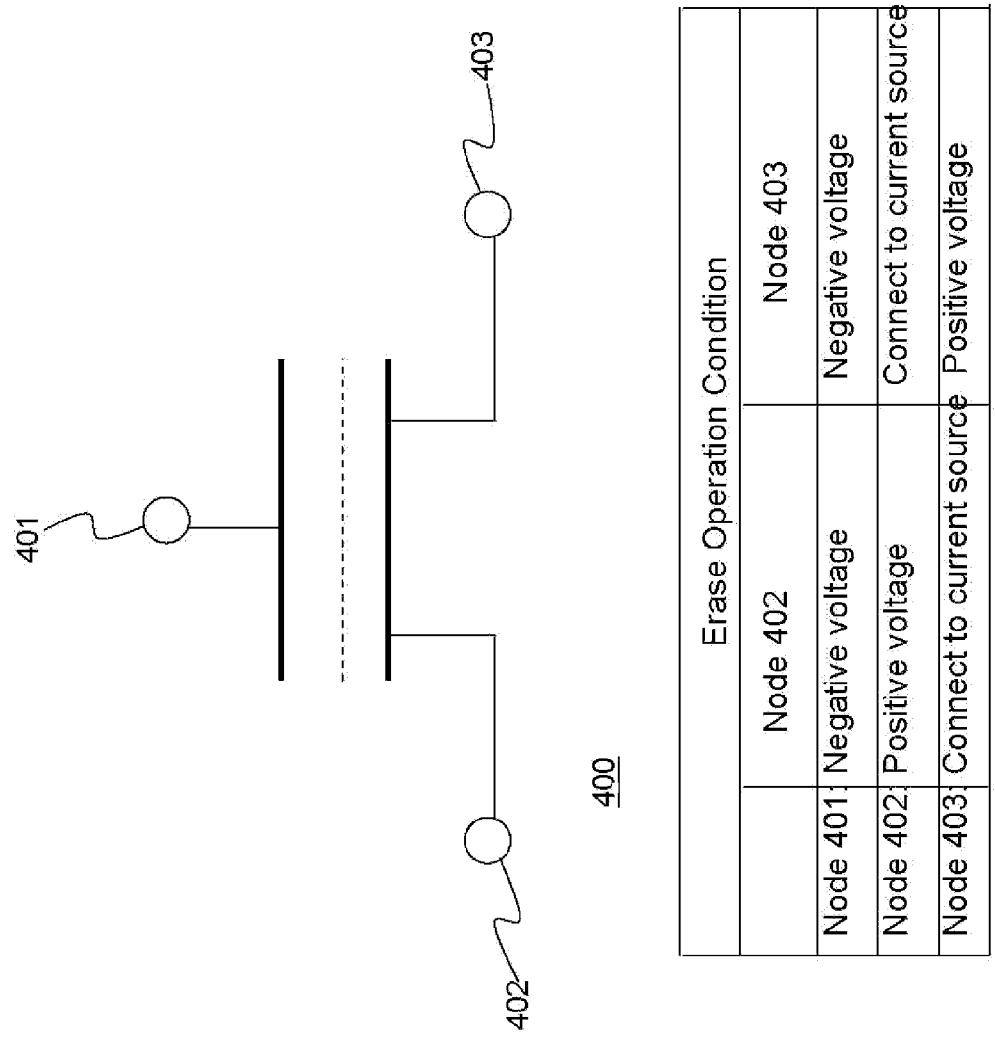
FIG. 4 is a circuit diagram illustrating a second embodiment of a memory cell structure in a nitride read-only memory cell having a node that is connected to a current source during a single side erasing operation in accordance with the present invention.

In FIG. 4, there is a circuit diagram illustrating a second embodiment of a memory cell structure in a nitride read-only memory cell having a node that is connected to a current source during a single side erasing operation. The nitride read-only memory cell structure 400 having a first node 401, a second node 402, and a third node 403. During a single side erase operation of the node 402, the node 401 is connected to a negative pump circuit, the node 402 is connected to a positive pump circuit, and the node 403 is connected to a current-limit source. During a single side erase operation of the node 403, the node 401 is connected to a negative pump circuit, the node 402 is connected to a current-limit source, and the node 403 is connected to a positive pump circuit. The current level of the current-limit source is selected to be some ratio of erase current consumption. Therefore, the voltage level of the node 403 is dynamic and related to the voltage level of the node 402. For example, if the bit line stepping is applied for an erase operation, the node 403 is adjusted.

Figure 5:
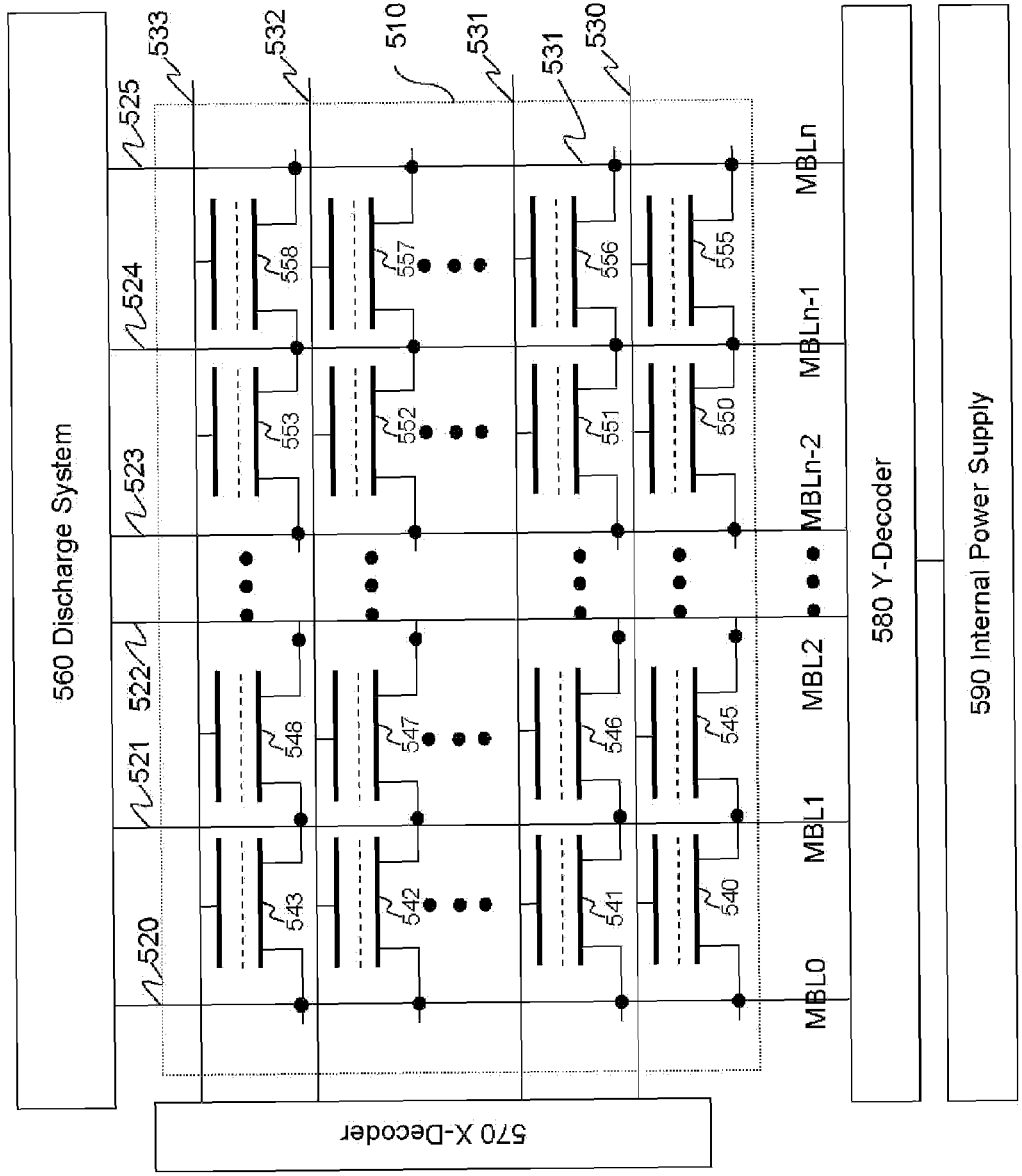
FIG. 5 is a simplified circuit diagram illustrating a virtual ground array with a nitride read-only memory array that is coupled to a discharge system for enhancing erase uniformity in accordance with the present invention.

Turning now to FIG. 5, there is shown a simplified circuit diagram illustrating a virtual ground array 500 with a nitride read-only memory array 530 that is coupled to a discharge system 560 for enhancing erase uniformity. The nitride read-only memory array 530 comprises a plurality of columns and rows of nitride read-only memory cells which include a nitride read-only memory cell 540, a nitride read-only memory cell 541, a nitride read-only memory cell 542, a nitride read-only memory cell 543, a nitride read-only memory cell 545, a nitride read-only memory cell 546, a nitride read-only memory 547, a nitride read-only memory cell 548, a nitride read-only memory cell 550, a nitride read-only memory cell 551, a nitride read-only memory cell 552, a nitride read-only memory cell 553, a nitride read-only memory cell 555, a nitride read-only memory cell 556, a nitride read-only memory cell 557 and a nitride read-only memory cell 558. The discharge system 560 includes a plurality of MOS transistors for discharging each metal bit line to either a common node or a current source. It is a circuit designer's choice whether to discharge each metal bit line to a common node as shown in FIG. 3 or to discharge each metal bit line to a current source as shown in FIG. 4. A Y-decoder 580 decodes which metal bit line (or which column) in the y direction will be decoded and accessed among metal bit lines MBL0 520, MBL1 521 MBL2 522, . . . MBLn-2 523, MBLn-1 524 or MBLn 525. A X-decoder 570 decodes which wordline (or which row) in the x direction will be decoded and accessed among metal bit lines 530, 531, . . . 532 or 533. A user supplies the addressing of the (x, y) location of a particular nitride read-only memory cell for programming or erasing of that nitride read-only memory cell. During an erase operation, which requires a positive voltage, an internal power supply 590 supplies power to the Y-decoder 580 for erasing a particular nitride read-only memory cell.

Figure 6:
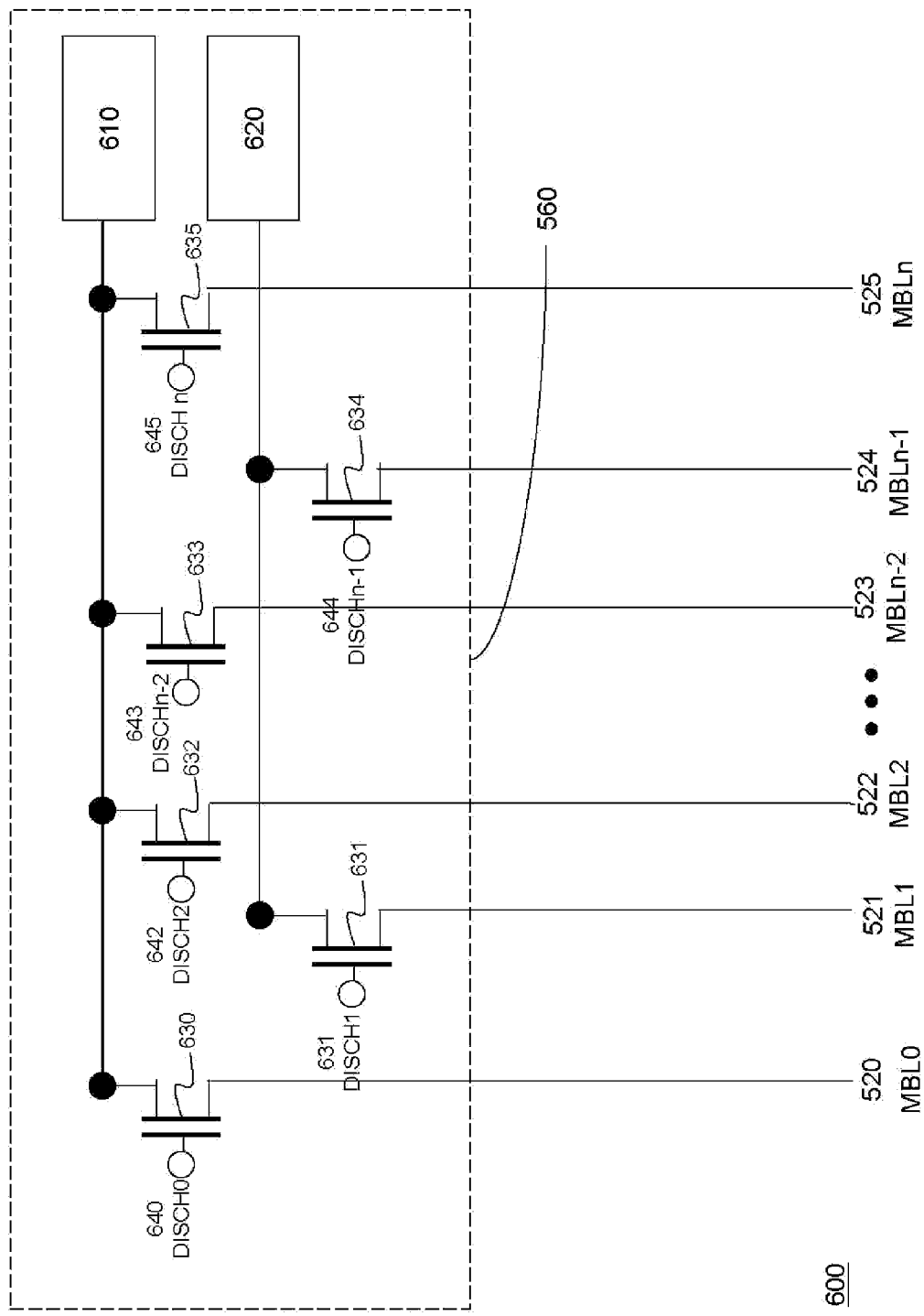
FIG. 6 is a simplified circuit diagram illustrating a discharge system for discharging even metal bit lines and odd metal bit lines in the nitride read-only memory array in accordance with the present invention.

As shown in FIG. 6, there is a simplified circuit diagram illustrating a discharge system 560 for discharging even metal bit lines and odd even bit lines in the nitride read-only memory array 500. During either a conventional program operation or a conventional erase operation, circuits 610 and 620 would typically be both connected to ground. An objective of a conventional erase operation is to discharge a nitride read-only memory cell to ground. The circuit 610 or the circuit 620 will be turned on for discharging odd metal bit lines or even metal bit lines depending on whether the left side or the right side of nitride read-only memory cells need to be discharged. The circuits 610 and 620 operate both as a common node in the first embodiment, or operate both as a current source in the second embodiment. The discharge system 560 comprises a set of even numbered MOS transistors 630, 632, 633, and 635 that are coupled to the circuit 610 and a set of odd numbered MOS transistors 631, and 634 that are couples to the circuit 620. Correspondingly, the even numbered MOS transistors are connected to the even numbered metal bit lines, while the odd numbered MOS transistors are connected to the odd numbered metal bit lines, i.e., the MOS transistor 630 is connected to the metal bit line MBL0 520, the MOS transistor 632 is connected to the metal bit line MBL2 522, the MOS transistor 633 is connected to the metal bit line MBLn-2 523, the MOS transistor 635 is connected to the metal bit line MBLn 525, the MOS transistor 631 is connected to the metal bit line MBL1 521, the MOS transistor 634 is connected to the metal bit line MBLn-1 523. Symbols DISCH0 640, DISCH1 641, DISCH2 642, DISCHn-2 643, DISCHn-1 644, and DISCHn 645 represent the control signals during erase operation in order to connect the non-erasing side to a common node. The control signal DISCH0 640 is connected to the MOS transistor 630 that serves as a pass gate to a common node turn on the metal bit line MBL0 520. The control signal DISCH1 641 is connected to the MOS transistor 631 that serves as a pass gate to the common node turn on the metal bit line MBL1 521. The control signal DISCH2 642 is connected to the MOS transistor 632 that serves as a pass gate to the common node turn on the metal bit line MBL0 522. The control signal DISCH2 643 is connected to the MOS transistor 633 that serves as a pass gate to the common node turn on the metal bit line MBL0 523. The control signal DISCH2 644 is connected to the MOS transistor 634 that serves as a pass gate to the common node turn on the metal bit line MBL0 524. The control signal DISCH2 645 is connected to the MOS transistor 635 that serves as a pass gate to the common node turn on the metal bit line MBL0 525.

In the first embodiment where the discharge system 560 discharges to the common node, when an operation makes a request to erase the left side of the nitride read-only memory cells, the positive voltage is supplied from the internal power supply 590 through the Y-decoder 580 to the left side of the nitride read-only memory cells, while the right side of the nitride read-only memory cells that include even metal bit lines, MBL0 520, MBL2 522, MBLn-2 523, and MBLn 525, are discharged to the common node 620. If an operation makes a request to erase the right side of the nitride read-only memory cells, the positive voltage is supplied from the internal power supply 590 through the Y-decoder 580 to the right side of the nitride read-only memory cells, while the left side of the nitride read-only memory cells that includes odd metal bit lines, MBL1 521, MBLn-1 524, are connected to the common node 610. The discharge system 560 is discharged to ground during programming.

In the second embodiment where the discharge system 560 discharges to a current source, when an operation makes a request to erase the left side of the nitride read-only memory cells, the positive voltage is supplied from the internal power supply 590 through the Y-decoder 580 to the left side of the nitride read-only memory cells, while the right side of the nitride read-only memory cells that include even metal bit lines, MBL0 520, MBL2 522, MBLn-2 523, and MBLn 525, are discharged to the current source 620. If an operation makes a request to erase the right side of the nitride read-only memory cells, the positive voltage is supplied from the internal power supply 590 through the Y-decoder 580 to the right side of nitride read-only memory cells, while the left side of nitride read-only memory cells that include odd metal bit lines, MBL1 521, MBLn-1 524, are connected to the current source 610. The 560 discharge system is discharged to ground during programming.

Figure 7:
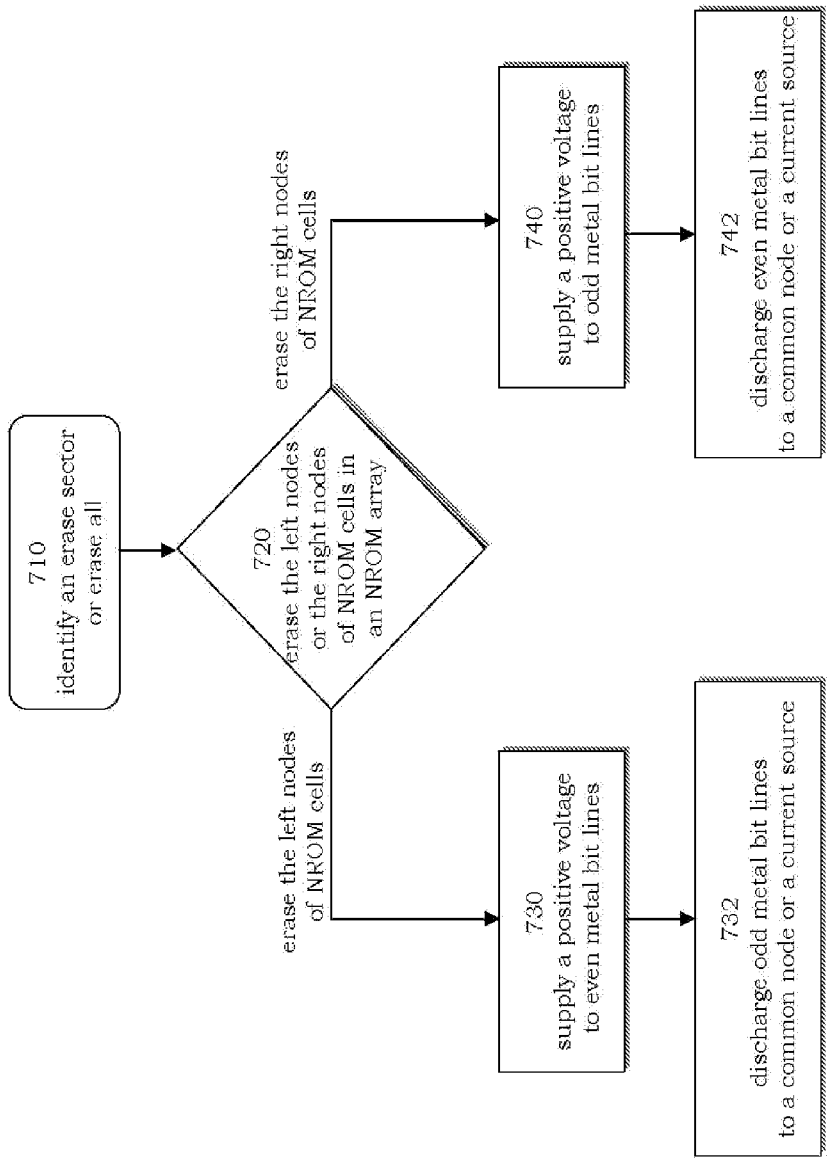
FIG. 7 is a flow chart illustrating the functional process in conducting a single side erase of nitride read-only memory cells in the nitride read-only memory array described with respect to the first embodiment in accordance with the present invention.

FIG. 7 is a flow chart illustrating the functional process 700 in conducting a single side erase of nitride read-only memory cells in the nitride read-only memory array described with respect to the first embodiment of the invention. At step 710, the process 700 determines the scope of erase, which a user may specify as a sector (or block) erase or erase all memory cells in the nitride read-only memory array 530. The process at step 720 determines whether the left nodes or the right nodes in the nitride read-only memory cells 540-543, 545-548, 550-553, and 555-558 are to be erased. On the one hand, if the left nodes are to be erased, the process 700 at step 730 erases0 the left nodes of nitride read-only memory cells by supplying a positive voltage from the internal power supply 590 to even metal bit lines MBL0 520, MBL2 521, MBLn-2 523 and MBLn 525. At step 732, the process 700 discharges the odd metal bit lines MBL1 521 and MBLn-1 524 to a common node or a current source. On the other hand, if the right nodes are to be erased, the process 700 at step 740 erases the right nodes of nitride read-only memory cells by supplying a positive voltage from the internal power supply 590 to odd metal bit lines MBL0 MBL1 521 and MBLn-1 524. At step 742, the process 700 discharges the even metal bit lines MBL0 520, MBL2 521, MBLn-2 523 and MBLn 525 to a common node or a current source.

Figure 8:
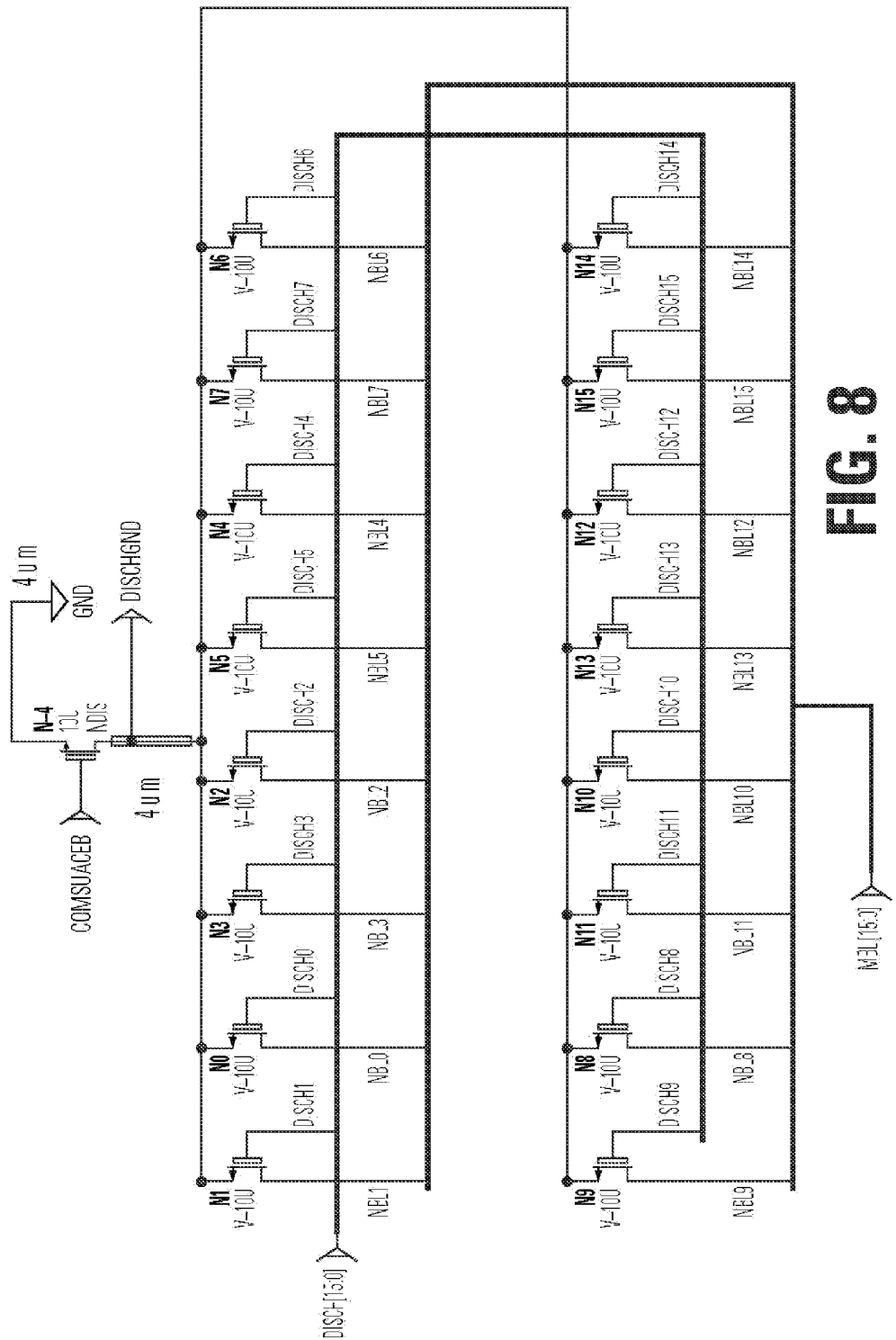
FIG. 8 is a schematic diagram illustrating an exemplary implementation of a discharge system in accordance with the present invention.

A schematic diagram in FIG. 8 illustrates an exemplary common node implementation of the discharge system 560. The discharge system 560 in this embodiment has sixteen MOS transistors, N0-N15. Each of the even MOS transistors N0, N2, N4, N6, N8, N10, N12, N14 is connected to a respective even metal bit line coupled to a nitride read-only memory array. Each of the odd MOS transistors, N1, N3, N5, N7, N9, N11, N13, and N15 is connected to a respective odd metal bit line coupled to the nitride read-only memory array. A signal name COMSUACEB represents a connection to a common node.

The invention has been described with reference to specific exemplary embodiments. Various modifications, adaptations, and changes may be made without departing from the spirit and scope of the invention. For example, although the present invention describes enhancing erase uniformity with single side erase of a node in a nitride read-only memory cell by connecting the non-erase side to a common node or a current-limit source, one of ordinary skill in the art should recognize that other types of connections or variations for achieving erase uniformity can be practiced without departing from the spirits of the present invention. Accordingly, the specification and drawings are to be regarded as illustrative of the principles of this invention rather than restrictive, the invention is defined by the following appended claims.

We claim:

1. A method for erase uniformity of a charge trapping memory array, the charge trapping memory array having a plurality of charge trapping memory cells, a plurality of even metal bit lines connecting to the left side of each charge trapping memory cell, a plurality of odd metal bit lines connecting to the right side of each charge trapping memory cell, comprising:
   erasing a respective left side in the plurality of charge trapping memory cells;
   supplying a positive voltage to even metal bit lines that connected to the left side of the plurality of charge trapping memory cells;
   discharging odd metal bit lines that are connected to the right side of the plurality of charge trapping memory cells to a common node.

2. The method of claim 1, wherein the common node has a voltage level that is sufficiently high to prevent punch-through yet sufficiently low to maintain a lateral electrical field for erase operation.

3. The method of claim 1, wherein the erasing step comprises erasing a block of charge trapping memory cells in the charge trapping memory array.

4. The method of claim 1, wherein the erasing step comprises erasing a column of charge trapping memory cells in the charge trapping memory array.

5. A method for erase uniformity of a charge trapping memory array, the charge trapping memory array having a plurality of charge trapping memory cells, a plurality of even metal bit lines connecting to the left side of each charge trapping memory cell, a plurality of odd metal bit lines connecting to the right side of each charge trapping memory cell, comprising:
   erasing a respective left side in the plurality of charge trapping memory cells;
   supplying a positive voltage to even metal bit lines that connected to the left side of the plurality of charge trapping memory cells;
   discharge odd metal bit lines that are connected to the right side of the plurality of charge trapping memory cells to a current source.

6. The method of claim 5, wherein the erase step comprises erasing a block of charge trapping memory cells in the charge trapping memory array.

7. The method of claim 5, wherein the erase step comprises erasing a column of charge trapping memory cells in the charge trapping memory array.

* * * * *